US007167112B2

(12) United States Patent
Andersen et al.

(10) Patent No.: US 7,167,112 B2
(45) Date of Patent: Jan. 23, 2007

(54) SYSTEMS AND METHODS FOR IMPLEMENTING A SAMPLE RATE CONVERTER USING HARDWARE AND SOFTWARE TO MAXIMIZE SPEED AND FLEXIBILITY

(75) Inventors: Jack B. Andersen, Austin, TX (US); Larry E. Hand, Meridian, MS (US); Daniel L. W. Chieng, Austin, TX (US); Joel W. Page, Austin, TX (US)

(73) Assignee: D2Audio Corporation, Austin, TX (US)

( * ) Notice: Subject to any disclaimer, the term of this patent is extended or adjusted under 35 U.S.C. 154(b) by 27 days.

(21) Appl. No.: 10/805,569

(22) Filed: Mar. 20, 2004

(65) Prior Publication Data

US 2004/0184573 A1 Sep. 23, 2004

Related U.S. Application Data

(60) Provisional application No. 60/469,761, filed on May 12, 2003, provisional application No. 60/456,430, filed on Mar. 21, 2003, provisional application No. 60/456,429, filed on Mar. 21, 2003, provisional application No. 60/456,428, filed on Mar. 21, 2003, provisional application No. 60/456,427, filed on Mar. 21, 2003, provisional application No. 60/456,422, filed on Mar. 21, 2003, provisional application No. 60/456,421, filed on Mar. 21, 2003, provisional application No. 60/456,420, filed on Mar. 21, 2003, provisional application No. 60/456,414, filed on Mar. 21, 2003.

(51) Int. Cl.
*H03M 7/00* (2006.01)
(52) U.S. Cl. .......................................... 341/61; 341/63
(58) Field of Classification Search .................. 341/61, 341/63, 50
See application file for complete search history.

(56) References Cited

U.S. PATENT DOCUMENTS 5,475,628 A * 12/1995 Adams et al. ............... 708/313

(Continued)

FOREIGN PATENT DOCUMENTS

GB 2267193 A 11/1993

OTHER PUBLICATIONS

Park, Sangil, et al.; A Novel Structure for Real-Time Digital Sample-Rate Converters with Finite Precision Error Analysis; Speech Proc'g 2, VLSI, Underwater Sig. Proc'g; Toronto; May 14-17, 1991; Int'l Conf. on Acoustics, Speech & Sig. Proc'g; ICASSP, NY, IEEE, US, vol. 2, Conf. 16, Apr. 14, 1991.

*Primary Examiner*—Linh Nguyen
(74) *Attorney, Agent, or Firm*—Law Offices of Mark L. Berrier

(57) ABSTRACT

Systems and methods for converting a digital input data stream from a first sample rate to a second, fixed sample rate using a combination of hardware and software components. In one embodiment, a system includes a rate estimator configured to estimate the sample rate of an input data stream, a phase selection unit configured to select a phase for interpolation of a set of polyphase filter coefficients based on the estimated sample rate, a coefficient interpolator configured to interpolate the filter coefficients based on the selected phase, and a convolution unit configured to convolve the interpolated filter coefficients with samples of the input data stream to produce samples of a re-sampled output data stream. One or more hardware or software components are shared between multiple channels that can process data streams having independently variable sample rates.

12 Claims, 4 Drawing Sheets

U.S. PATENT DOCUMENTS

| | | | |
|---|---|---|---|
| 5,481,568 A | * | 1/1996 | Yada .......................... 375/340 |
| 5,986,589 A | * | 11/1999 | Rosefield et al. ............. 341/61 |
| 6,057,789 A | * | 5/2000 | Lin .............................. 341/61 |
| 6,061,410 A | * | 5/2000 | Linz ........................... 375/371 |
| 6,134,268 A | | 10/2000 | McCoy |
| 6,593,807 B1 | * | 7/2003 | Groves et al. ................. 330/10 |
| 2002/0105448 A1 | * | 8/2002 | Freidhof ...................... 341/61 |
| 2002/0190880 A1 | * | 12/2002 | McLaughlin et al. ......... 341/61 |
| 2003/0179116 A1 | * | 9/2003 | Oki .............................. 341/61 |

* cited by examiner

SYSTEMS AND METHODS FOR IMPLEMENTING A SAMPLE RATE CONVERTER USING HARDWARE AND SOFTWARE TO MAXIMIZE SPEED AND FLEXIBILITY

RELATED APPLICATIONS

This application claims priority to: U.S. Provisional Patent Application No. 60/469,761, entitled "Systems and Methods for Implementing a Sample Rate Converter Using Hardware and Software to Maximize Speed and Flexibility," by Andersen, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND OF THE INVENTION

1. Field of the Invention

The invention relates generally to audio amplification systems, and more particularly to systems and methods for converting input data streams having a first sample rate to output data streams having a second data rate.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

There are a number of problems with existing digital PWM modulation schemes. One of the problems is that the performance and quality characteristics of the remainder of the signal processing system vary with the application. The exact implementation of the total system solution and the end-user application is not deterministic. As a result, implementation details cannot be accounted for apriori. Because existing technologies require application-specific solutions, they typically are not flexible, scalable or transportable to other applications. Consequently, these technologies generally are not applicable to mainstream systems.

One area in particular where existing digital PWM modulation schemes do not meet mainstream system requirements is in the processing of digital input data streams having various sample rates. These input data streams may have different sample rates, depending upon the type of device that provides the data, as well as the particular design of the device. The input data streams may also use different clock sources that may have slightly different rates or may drift with respect to one another. Existing technologies require a single input sample rate, or multiple fixed, known input rates, and cannot adapt to the different rates at which devices may provide the input data.

Another problem with prior art systems is that, because they do not have a sample rate converter that can generate a local clock signal, they typically regenerate the PWM clock signal from the input data. This regenerated clock signal cannot support the higher performance that is possible with a locally generated clock signal.

SUMMARY OF THE INVENTION

One or more of the problems outlined above may be solved by the various embodiments of the invention. Broadly speaking, the invention comprises systems and methods for converting a digital input data stream from a first sample rate to a second sample rate using a combination of hardware and software components. In one embodiment, the conversion from the first sample rate to the second sample rate is performed in a sample rate converter for a digital audio system. The sample rate converter has multiple components, some of which are implemented in hardware and some of which are implemented in software. Whether each component is implemented in hardware or software depends upon the performance requirements of the component. Components that achieve better performance in software are implemented in software, while those that achieve better performance in hardware are implemented in hardware. It should be noted that performance may be improved, not only in audio performance measures, but also in computational complexity, the "fit" of components onto the software engine, and in other areas.

One embodiment comprises a sample rate converter system including a rate estimator configured to estimate the sample rate of an input data stream, a phase selection unit configured to select a phase for interpolation of a set of polyphase filter coefficients based on the estimated sample rate, a coefficient interpolator configured to increase phase resolution by interpolating the filter coefficients based on the selected phase, and a convolution unit configured to convolve the interpolated filter coefficients with samples of the input data stream to produce samples of a re-sampled output data stream. As indicated above, these system components include both hardware and software components. In one embodiment, the system includes two or more channels, each of which is capable of receiving an input data stream having a different, variable sample rate than the data streams received by the other channels. In one embodiment, the different channels share one or more common components with the other channels. In one embodiment, the sample rate converter system is coupled to an audio amplification system and is configured to convert input data streams to a common output sample rate for processing by amplifier components such as an audio effects unit or a pulse width modulator.

Another embodiment comprises a method which includes the steps of receiving an input data stream having an input sample rate and processing the input data stream using a combination of hardware and software components to produce an output data stream having a output sample rate that is different from the input sample rate. In one embodiment, the processing comprises estimating the input sample rate, selecting a phase for interpolation of a set of polyphase filter coefficients, interpolating the set of polyphase filter coefficients, convolving the set of interpolated polyphase filter coefficients with samples of the input data stream, and providing resulting samples of the output data stream. In one embodiment, the method comprises receiving and processing two or more input data streams having independently variable sample rates on separate channels to produce corresponding output data streams having a common output sample rate. At least a portion of the processing of the different data streams in the different channels is performed in common with or software components.

Numerous additional embodiments are also possible.

The use of both hardware and software components may provide a number of advantages over prior art systems. One potential advantage is that components for which processing speed is important may be implemented in dedicated hardware to maximize their performance, while other components for which flexibility is more important can be implemented in software. Another potential advantage is that hardware and/or software components may be common to (shared by) multiple channels, thereby reducing the cost and complexity of the system, while retaining the speed and flexibility of the system. Another potential advantage is that each of the channels may be able to handle input sample rates which are variable and which are independent of the sample rates of data streams on other channels. Another potential advantage is that the generation of a local, high-performance clock signal enables the PWM output to meet higher performance standards than if the clock signal must be regenerated from the input data.

BRIEF DESCRIPTION OF THE DRAWINGS

Other objects and advantages of the invention may become apparent upon reading the following detailed description and upon reference to the accompanying drawings.

Figure 1:
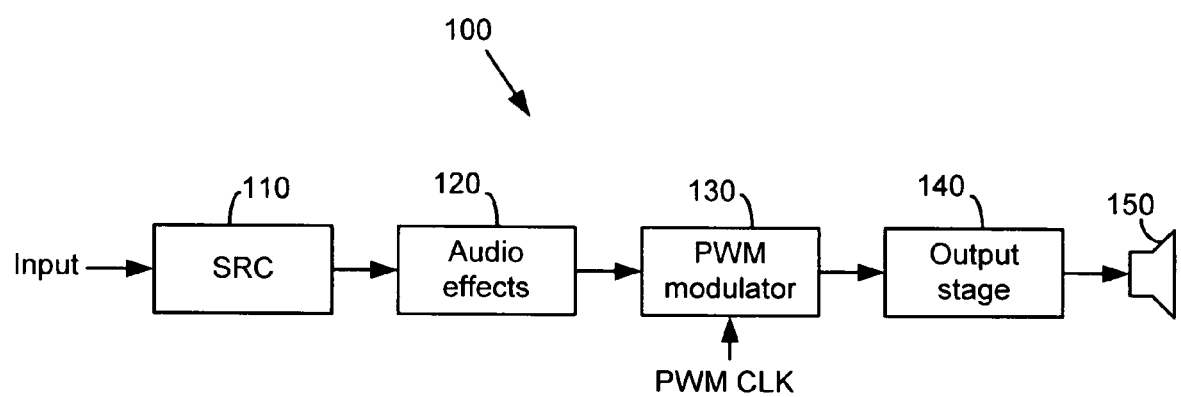
FIG. 1 is a functional block diagram illustrating a digital audio amplification system using PWM technology.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for converting a digital input data stream from a first sample rate to a second sample rate using a combination of hardware and software components. As used herein, "hardware" refers to dedicated, fixed-function logic. "Software," on the other hand, is used to refer to programmable logic that is controlled by an algorithm defined by a programmer, or utilizing generic programmable blocks under software, as in a digital signal processor (DSP) arithmetic logic unit (ALU) or memory.

In one embodiment, the conversion from the first sample rate to the second sample rate is performed in a sample rate converter for a digital audio system. The sample rate converter has multiple components, some of which are implemented in hardware and some of which are implemented in software. Whether each component is implemented in hardware or software depends upon the performance requirements of the component. Components that achieve better performance in software are implemented in software, while those that achieve better performance in hardware are implemented in hardware. As noted above, performance may measured in terms of the audio performance, computational complexity, etc., using such metrics as the number of processor cycles required for operations, device size, implementation cost, flexibility, power consumption and the like.

The use of both hardware and software components may provide a number of advantages over prior art systems which are conventionally implemented either entirely in hardware or entirely in software. For example, components for which processing speed is important may be implemented in dedicated hardware to maximize their performance. For other components, processing speed may be less important than flexibility. These components may be implemented in software in order to provide the desired flexibility. Another advantage of the use of both hardware and software components is that some of the components may be used for multiple channels. By sharing some of the components between channels, the cost and complexity of the system may be reduced, while retaining the speed and flexibility of the system.

A preferred embodiment of the invention is implemented in an audio amplification system. As noted above, pulse width modulation (PWM) technology has recently been applied in audio amplification systems, but has suffered from the drawbacks of conventional methodologies. These methodologies employ analog modulation schemes which are complex and costly, and which provide relatively poor performance. The present systems and methods are instead implemented in digital modulation schemes and employ methodologies which overcome some of the problems that existed in the prior art.

Referring to FIG. 1, a functional block diagram illustrating a digital audio amplification system using PWM technology is shown. In this embodiment, system 100 receives a digital input data stream from a data source such as a CD player, MP3 player, digital audio tape, or the like. The input data stream is received by sample rate converter 110. The input data stream has a particular sample rate which depends upon the data source. This sample rate is typically one of a set of predetermined sample rates that are used by the corresponding type of device. For example, a CD player may output digital data with a sample rate of 44.1 kHz, while a digital audio tape player may output data with a sample rate of 32 kHz.

In the present systems and methods, sample rate converter 110 converts the input data stream from the sample rate at which it was received to a predetermined internal rate which is used within system 100. In one embodiment, this internal sample rate is 100 kHz. Thus, if data is received at a sample rate of 50 kHz, sample rate converter 110 will re-sample the data to produce a corresponding internal data stream at a sample rate of 100 kHz. This internal data stream is then provided to an audio effects subsystem 120. Audio effects subsystem 120 performs any desired processing on the internal data stream and provides the resulting processed data stream to PWM modulator 130.

The data stream received by PWM modulator 130 represents a pulse code modulated signal. PWM modulator 130 converts this data stream to a pulse width modulated signal. The pulse width modulated signal is then provided to output stage 140. In output stage 140 amplifies the pulse width modulated signal and may perform some filtering or further processing of the amplified signal. The resulting signal is then output to a speaker system 150, which converts the electrical signal to an audible signal which can be heard by a listener.

The present disclosure focuses on the sample rate converter in the audio system described above. As explained above, the purpose of the sample rate converter is to receive an input data stream which is sampled at a first rate, and to generate an output data stream which is sampled at a second rate. While the audio signal which is represented by the data stream remains essentially unchanged (at least in some embodiments), the sampling rate is changed to conform to the requirements of the audio system so that it can be processed by the system.

Figure 2:
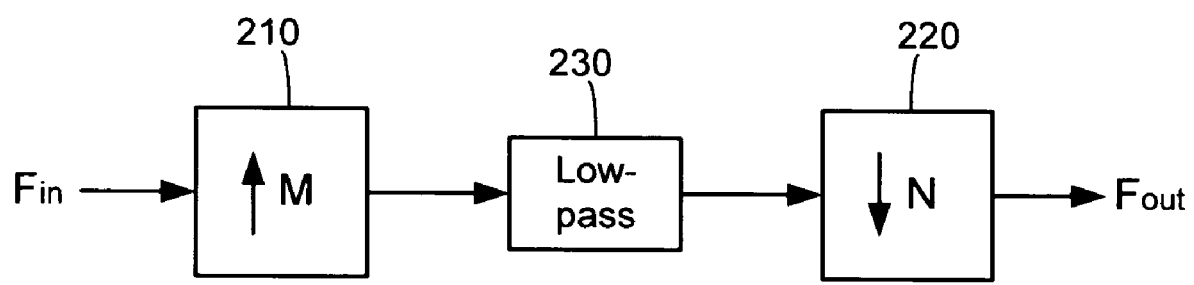
FIG. 2 is a diagram illustrating the manner in which sample rate conversion is typically performed.

Referring to FIG. 2, a diagram illustrating the manner in which sample rate conversion is typically performed is shown. As depicted by this figure, an input data stream is first up-sampled, or interpolated, by a first filter 210, and is down-sampled, or decimated, by a second filter 220. An intermediate filter 230 is used to low-pass filter the up-sampled data before it is decimated. The input data stream has a first sample rate, $F_{in}$. This data stream is up-sampled by a factor of M. Thus, after up-sampling, the data stream has a sample rate of $M \times F_{in}$. The up-sampling is typically achieved by interpolating between the samples of the input data stream to generate intermediate samples. M is chosen so that the intermediate sample rate ($M \times F_{in}$) is higher than the desired output sample rate, $F_{out}$. Typically, the intermediate rate is much higher than the desired output rate.

The up-sampled data stream is low-pass filtered and then decimated to reduce the sample rate from the intermediate rate to the desired output rate. After down-sampling, the sample rate is $F_{out}=(M/N) \times F_{in}$. The down-sampling, or decimation, of the data stream is typically accomplished by dropping samples from the intermediate data stream. For example, if the intermediate data stream is sampled at 200 kHz and the desired output sample rate is 100 kHz, every other sample will be dropped.

Ideally, M and N are integers. If M is an integer, the up-sampling of the input data stream comprises inserting M−1 new samples, evenly spaced between each of the original samples. Then, if N is an integer, the down-sampling of the intermediate data stream comprises taking only every Nth sample and dropping the rest. This is illustrated in FIG. 3.

Figure 3:
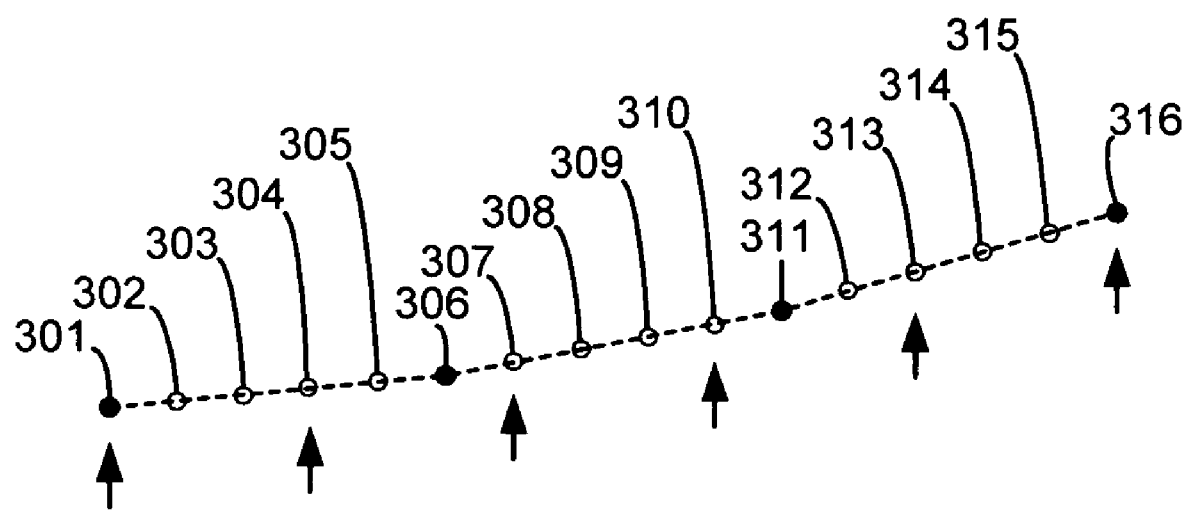
FIG. 3 is a diagram illustrating the interpolation and decimation of a sampled input signal to produce a corresponding signal at a different sample rate.

FIG. 3 is a diagram illustrating the interpolation and decimation of a sampled input signal to produce a corresponding signal at a different sample rate. In this figure, the input samples are represented by points 301, 306, 311 and 316. The straight-line interpolated value of the signal is represented by the dotted lines. The signal is up-sampled by a factor of 5, so 4 additional sample points are interpolated between each pair of adjacent samples. Thus, points 302–305 are inserted in the interval between sample 301 and sample 306. Likewise, points 307–310 are inserted between samples 306 and 311, and points 312–315 are inserted between samples 311 and 316. After being low-pass filtered, the resulting points (301–316) are down-sampled by a factor of 3, so every third point is used, and the remainder are discarded. The resulting data stream consists of samples 301, 304, 307, 310, 313 and 316 (as indicated by the arrows).

One of the problems with a straightforward implementation of the up-sampling and down-sampling of the input data stream is that, in order to make M and N integers, and in order to maintain the desired resolution, M and N typically must be very large numbers. Consider the example of FIG. 3. If $F_{in}$ is 60 kHz and $F_{out}$ is 100 kHz, M is 5 and N is 3. If $F_{in}$ were 60.5 kHz instead of 60 kHz, however it would be necessary to select M=200 and N=121. Scenarios requiring even higher values for M and N can easily be developed. Based upon the resolution of the sample rate converter in the preferred embodiment, values of up to $2^{18}$ might be necessary.

Another problem with the interpolation-and-decimation methodology is that it may be difficult to handle variations in the sample rates of the received data streams. In typical audio systems, each device or component may generate its own clock signal upon which the corresponding sample rate is based. Even if the clock signals for two components are intended to be identical, however, the clock signals are not synchronized and may have slight variations. As a result of the differences in clock signals, data may be dropped, or buffers may overflow, resulting in errors. The present sample rate converter is designed to handle these differences.

It should be noted that audio systems may also include various different types of audio sources. For example, the audio signal may be generated by a CD player, MP3 player, digital audio tape or the like. These devices may be configured to generate audio signals at different sample rates. For instance, a CD player may provide an output signal that has a 44.1 kHz sample rate, while a digital audio tape player may generate an output signal at a 32 kHz sample rate. The present systems and methods enable the sample rate converter to accommodate multiple different sample rates in the input data stream. Moreover, the sample rate converter is capable of independently adjusting each channel to accommodate a different input sample rate. By comparison, prior art systems can only accommodate different sample rates on different channels if the two sample rates are known.

The accommodation of different sample rates, and variations between rates that are nominally the same, may be achieved through the use of a polyphase filter. The polyphase filter performs the functions of both interpolator 210 and decimator 220. The polyphase filter performs these functions by interpolating the input data stream in a manner which does not require that the data stream be up-sampled by an integer factor or down-sampled by an integer factor.

The interpolator and the decimator described above are typically implemented as (FIR-type) filters. The polyphase filter is obviously also a filter, but rather than generating a large number of samples (as performed by the interpolation filter) and then throwing away unneeded samples and (as performed by the decimation filter), the polyphase filter generates only those samples that will, in the end, be retained. Thus, compared to the example of FIG. 3, rather than generating samples 301–316 and then discarding two-thirds of these samples, only samples 301, 304, 307, 310, 313 and 316 are generated, and none are discarded.

The polyphase filter is defined by a set of filter coefficients. If the coefficients are extrapolated to a different set of coefficients, different sampling rates are achieved. This enables non-integer sample rate conversion through the choice of appropriate filter coefficients.

A typical sample rate converter that uses polyphase filters contains memory for storing samples from the input data stream, memory for storing filter coefficients, hardware for performing interpolation calculations for the filter coefficients, and a multiply-accumulate unit for calculating inner products of the data and coefficients. Typically, these components are all implemented using dedicated hardware. This is very costly, particularly in terms of the additional logic required to perform the calculations, and in terms of the dedicated memories that are needed for input sample data. These memories are relatively small and therefore utilize silicon area in a manner that is relatively inefficient. While it is also possible to implement a sample rate converter entirely in software, such implementations typically cannot provide the speed necessary to support audio applications.

The present systems and methods therefore utilize a combination of hardware and software components to achieve both speed and efficiency in the sample rate converter. These systems and methods make use of processors that have sufficient computational power and memory reserves to implement the required components.

Figure 4:
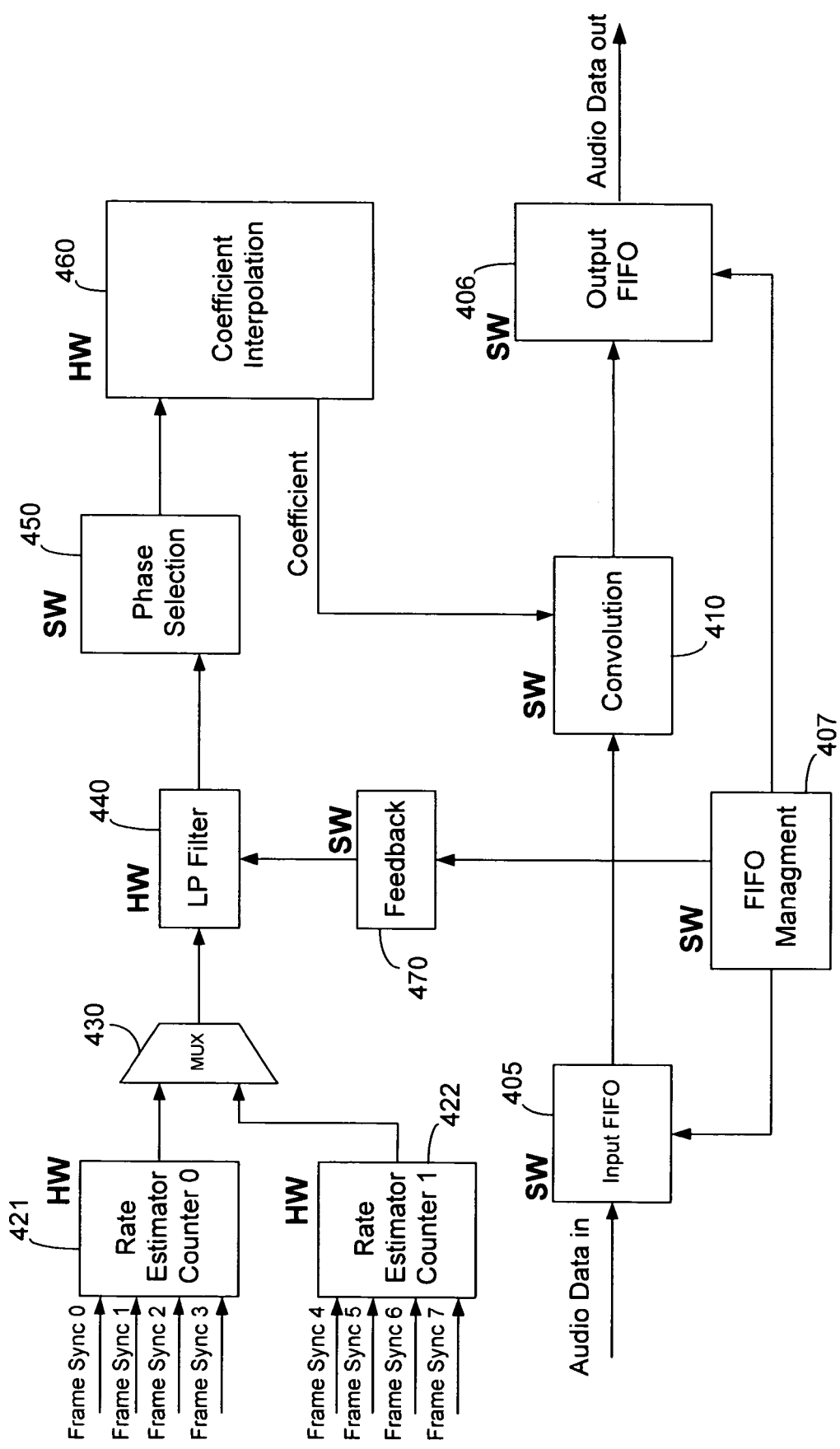
FIG. 4 is a diagram illustrating the components of a sample rate converter in accordance with one embodiment of the invention.

Referring to FIG. 4, a diagram illustrating the components of a sample rate converter in accordance with one embodiment of the invention is shown. The lower half of the figure generally corresponds to a data path for the audio data that will be converted, while the upper half of the figure corresponds to a control path for controlling the actual sample rate conversion.

As shown in FIG. 4, samples of an audio data stream are received and stored in an input FIFO 405. The input data stream has a sample rate of $F_{in}$. The samples are read from FIFO 405 and convolved with a set of interpolated coefficients by convolution engine 410. Convolution engine 410 effectively up-samples or down-samples the data to produce samples at a rate equivalent to the output rate ($F_{out}$) of the sample rate converter. These samples are stored in an output FIFO 406. The samples are then read out of output FIFO 406 at rate $F_{out}$.

Frame sync signals associated with the audio data are received by rate estimator counters 421 and 422. Rate estimator counters 421 and 422 simply count the numbers of clock cycles between samples received on the respective channels. (It should be noted that, while the present embodiment has two channels, and corresponding rate estimators, other embodiments may handle N channels and have N corresponding sets of components.) One of the rate estimator counters is selected by multiplexer 430 and the corresponding count is filtered by low pass filter 440. The filtered sample rate count is forwarded to phase selection unit 450, and is used to interpolate the filter coefficients for the polyphase filter. The interpolated polyphase filter coefficients are then convolved with the data samples in convolution unit 410 to produce the re-sampled data.

The flow of data samples through FIFO 405 and FIFO 406 are managed by FIFO management unit 407. based on the flow of data, FIFO management unit 407 provides feedback to feedback unit 470. This feedback is used to adjust low pass filter 440. Effectively, this adjusts the sample rate which is estimated and thereby adjusts the coefficient interpolation performed in the sample rate converter. The sample rate conversion is thereby also adjusted to more closely track the actual input sample rate and to prevent the overflow or underflow of FIFOs 405 and 406.

It can be seen that the components of FIG. 4 are identified as either hardware (HW) or software (SW). In this embodiment, the hardware components include input and output FIFOs 405 and 406, rate estimator counters 421 and 422, multiplexer 430 low pass filter 440 and coefficient interpolator 460. These components are implemented in hardware for a variety of reasons. For example, coefficient interpolator 460 is implemented in hardware because the interpolation process must be performed quickly enough to provide filter coefficients that will be convolved with the data samples in convolution unit 410. Rate estimator counters 421 and 422 are easily and efficiently implemented in hardware because they are simple counters needing fast updates, rather than being complete rate estimation units. The values of the counters are read by software that actually performs the rate estimation (and which in one embodiment is common to all of the channels). Feedback unit 470 is efficiently implemented in software, while input and output FIFOs 405 and 406 are efficiently implemented in memory space that is controlled as FIFOs by software. In other words, FIFOs 405 and 406 are not implemented as small, separate memories, but instead make use of the larger memory space of the DSP.

In one embodiment, rate estimator counters 421 and 422 are 24-bit counters. Each can select from four input frame sync signals: SAI LRCK; SPDIF RX frame sync; Packet Data frame sync; and ESSI frame sync. The period measurement is accomplished by counting the number of DSP clock cycles within the counting period of the frame sync signal. The counting period is programmable, typically with the period equal to 1. In this embodiment, the count is multiplied by a gain. The gain is a 12-bit integer which is typically set to a power of 2, which is equivalent to moving a decimal point. This may facilitate increased resolution in low-pass filter 440.

Low pass filter 440 is, in one embodiment, a second-order IIR filter. This filter may, for example, comprise a pair of cascaded first-order IIR filters. Low pass filter 440 attenuates jitter in the count received from the rate estimator counter. This ensures that the count changes slowly, and thereby improves the quality of the sample rate conversion. The averaging process that is implemented by the low pass filter causes the potential for buffer underflow or overflow. This problem is corrected by implementing closed loop feedback in the software which adjusts a 24-bit offset that is added to the count value before the value is passed through low pass filter 440. In one embodiment, the filter coefficient of low pass filter 440 is adjustable to allow faster frequency and phase lock.

Coefficient interpolator 460 works in conjunction with the ROM in which the coefficients are stored and the ROM address generator that provides addresses for retrieval of the coefficients for use by the interpolator. The filter coefficients are actually stored in two ROMs—one stores even coefficients, while the other stores odd coefficients. The interpolator performs a cubic spline interpolation. The interpolator employs a five-stage, two-cycle pipeline to perform the interpolation, thereby enabling resource sharing while maintaining a throughput of one interpolation per two clock cycles.

The components that are implemented in software include convolution unit 410, phase selection unit 450, FIFO management unit 407 and feedback unit 470. These components provide flexibility that is not possible in the strictly hardware implementations of the prior art. The software components read the values of the rate estimator counters 421 and 422 and determine the input sample rates from these values. The rate estimates are adjusted by feedback from software components such as FIFO management unit 407 and feedback unit 470. The estimated rates are then used by phase selection software 450 to interpolate the polyphase filter coefficients, and the convolution of the coefficients with the input data samples is performed by convolution unit 410. Convolution unit 410 is implemented in software because a typical DSP can efficiently perform this function while reading in samples from main memory and coefficients from coefficient interpolator 460.

In one embodiment, the software of the sample rate converter is responsible for performing a number of tasks. For example, as mentioned above, rate estimator counters 421 and 422 multiply their respective counter values by a gain, but the gain is determined by the software. Similarly, the offset and filter coefficients for the low pass filter following the rate estimator counters are determined by the software. The software is further responsible for calculating the ratio of the input sample rate ($F_{in}$) to the output sample rate ($F_{out}$), which is fixed in the preferred embodiment. Based upon the ratio of sample rates and the filtered counter values, the software determines the filter length, phase and phase increment for interpolation of the polyphase filter coefficients. Further, the software is responsible for convolving the polyphase filter coefficients with the input samples, managing the input and output FIFOs, and providing feedback for adjustment of the estimated input sample rate.

The software components are implemented in a data processor. Typical modern processors have the capability of executing tight loops very efficiently while reading in data streams. For example, digital signal processors (DSP's) have "zero overhead looping" capability. Modern microcontrollers also have the capability of executing multiple instructions per cycle. These DSP's and microcontrollers typically also have separate program and data memories that make them suitable for sample rate converter applications.

These processors have the capability, for example, to execute the following in one processor cycle: read a data sample from memory (as indicated by a sample pointer register); update the sample pointer register to point to a next sample; fetch a coefficient value from the peripheral coefficient interpolation unit; multiply the data sample by the coefficient value; and add (accumulate) the result of the multiplication in a data register. If the polyphase filter contains X coefficients, X clock cycles are used to compute one output sample.

A processor can handle a number of parallel channels Y at the same time, where Y is limited by the available number of accumulator and sample pointer registers. When Y channels are processed simultaneously using identical coefficients, relatively compact hardware can be designed to perform the following in Y or less cycles: read a number of coefficients from memory (as indicated by coefficient pointer); update a coefficient pointer register; and perform interpolation to calculate filter coefficients to a desired precision.

In "pseudo C" the processor would do the following:

```
for every output sample
    Initialize the hardware coefficient calculator
    for j=1 to Y
        o[Y] = 0;              // Initialize accumulators
        p[Y] = start(N);       // Initialize pointers
    for i=1 to X               // For every coefficient
        C = mem[coeff]         // Read coefficient
        for j=1 to Y           // For every channel
            o[Y] += C*mem[p[Y]++]
```

Typically, the inner loop using j would be unrolled, and reading the next coefficient would be done in parallel with the last iteration (j=Y). A simple and efficient processor would calculate a new coefficient for every Y cycles. A more flexible solution would calculate a coefficient in Y or fewer cycles. When a new sample becomes available, it will halt computations until this sample is read and thereby automatically adjust to the rate at which the DSP reads the filter coefficients. Besides making the actual value of Y more flexible, this also allows the processor to periodically halt the computations and service other functions like interrupts.

The various embodiments of the invention may provide a number of advantages which were not available in the prior art. For example, at a very high level, the combination of hardware and software components allows the present systems and methods to provide greater speed and flexibility in the performance of sample rate conversion functions than prior art systems that were implemented entirely in hardware, or entirely in software. They may also be implemented more efficiently than in the prior art.

In some embodiments, components of the sample rate converter may be shared between two or more independent sample rate conversion paths. For instance, two different paths may both use the same polyphase filter coefficients interpolation hardware, potentially including the ROMs that store the coefficients, the address generator and the interpolator itself. Another example of resources that are shared across sample rate conversion paths is the data processor that executes the software components of the respective paths. Despite the shared resources, the sample rate conversion paths each perform their respective sample rate conversion functions independently of the others.

Another advantage of at least some embodiments of the invention is the ability to process input data streams that have sample rates which are allowed to vary. Because each sample rate conversion path includes a sample rate estimator to determine the input sample rate, as well as various components to adapt the function of the sample rate converter to this input sample rate, the sample rate converter is not subject to errors from variations in the sample rates. A related advantage is the ability to independently adapt two different sample rate conversion paths to input data streams which have different sample rates.

Another advantage is the ability to simplify the implementation of some of the components of the sample rate converter. For example, in one embodiment, the rate estimator hardware for each sample rate conversion path consists of a simple counter. That counter can easily be read by a software component, which can then determine the sample rate of an input data stream based upon the value of the counter.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A sample rate converter comprising:
   a plurality of sample rate converter components, including:
   a rate estimator;
   a low pass filter, wherein an output of the rate estimator is passed through the low pass filter;
   a phase selection unit, wherein an output of the low pass filter is provided to the phase selection unit;
   a polyphase coefficient interpolator, wherein a set of interpolated polyphase filter coefficients is generated by the polyphase coefficient interpolator based upon an output of the phase selection unit;
   a convolution unit configured to convolve the interpolated polyphase filter coefficients with a corresponding sample of an input data stream;
   an input FIFO configured to receive samples of the input data stream and to provide the samples of the input data stream to the convolution unit;
   an output FIFO configured to receive samples of an output data stream from the convolution unit; and
   a FIFO management unit coupled to the input and output FIFOs and configured to provide feedback to the low pass filter;
   wherein a first portion of the components comprise hardware components; and
   wherein a second portion of the components comprise software components.

2. The sample rate converter of claim 1, wherein the rate estimator, the low pass filter and the polyphase coefficient interpolator are implemented in hardware.

3. The sample rate converter of claim 1, wherein the phase selection unit, the convolution unit and the FIFO management unit are implemented in software.

4. The sample rate converter of claim 1, wherein the rate estimator comprises a counter which is configured to count sample periods of the input data stream and wherein an input sample rate is computed by a software component based upon a value of the counter.

5. The sample rate converter of claim 1, wherein the sample rate converter comprises two or more channels for processing input data streams, wherein the two or more channels share one or more of the plurality of sample rate converter components.

6. The sample rate converter of claim 1, wherein the sample rate converter comprises two or more channels for processing input data streams, wherein each of the two or more channels is configured to process an input data stream having a sample rate that is independent of sample rates of input data streams processed by the other channels.

7. The sample rate converter of claim 6, wherein each channel includes an independent rate estimator.

8. The sample rate converter of claim 7, wherein each rate estimator includes a separate sample period counter.

9. The sample rate converter of claim 8, wherein a sample rate of each input data stream is determined by reading each sample period counter with a common software component.

10. The sample rate converter of claim 8, wherein one of the channels is a primary channel and the remainder of the channels are secondary channels, wherein a sample rate is estimated for the primary channel, wherein for each secondary channel a ratio of a corresponding sample period counter to the primary channel sample period counter is determined, and wherein a sample rate for each secondary channel is determined to be the sample rate estimated for the primary channel times the ratio.

11. The sample rate converter of claim 6, wherein each channel implements a polyphase filter, wherein coefficients for each polyphase filter implementation are interpolated from a common set of filter coefficients.

12. The sample rate converter of claim 1, wherein the sample rate converter is coupled to a pulse width modulated audio amplifier.

* * * * *

UNITED STATES PATENT AND TRADEMARK OFFICE
CERTIFICATE OF CORRECTION

PATENT NO. : 7,167,112 B2 Page 1 of 1
APPLICATION NO. : 10/805569
DATED : January 23, 2007
INVENTOR(S) : Andersen et al.

It is certified that error appears in the above-identified patent and that said Letters Patent is hereby corrected as shown below:

On the title page item (75), after "Joel W. Page, Austin, TX (US)", add --Wilson E. Taylor, Austin, TX (US)--.

Signed and Sealed this

Twenty-first Day of April, 2009

JOHN DOLL
*Acting Director of the United States Patent and Trademark Office*